United States Patent [19]
Tsujimoto

[11] Patent Number: 5,267,215
[45] Date of Patent: Nov. 30, 1993

[54] SEMICONDUCTOR MEMORY DEVICE WITH TRANSFER GATES ARRANGED TO SUBDIVIDE BIT LINES

[75] Inventor: Akira Tsujimoto, Tokyo, Japan
[73] Assignee: NEC Corporation, Tokyo, Japan
[21] Appl. No.: 789,885
[22] Filed: Nov. 12, 1991
[30] Foreign Application Priority Data
  Nov. 9, 1990 [JP] Japan .................... 2-305384
[51] Int. Cl.$^5$ ................... G11C 8/00; G11C 7/00
[52] U.S. Cl. ................... 365/230.03; 365/203
[58] Field of Search ............. 365/230.03, 203

[56] References Cited

U.S. PATENT DOCUMENTS

| | | | |
|---|---|---|---|
| 4,050,061 | 9/1977 | Kitagawa | 365/205 |
| 4,370,575 | 1/1983 | McAlexander, III et al. | 365/203 |
| 4,520,465 | 5/1985 | Sood | 365/203 |
| 4,528,646 | 7/1985 | Ochii et al. | 365/203 |
| 4,777,625 | 10/1988 | Sakui et al. | 365/207 |
| 4,926,382 | 5/1990 | Sakui et al. | 365/203 |
| 4,969,125 | 11/1990 | Ciraula et al. | 365/203 |
| 4,977,538 | 12/1990 | Anami et al. | 365/230.03 |
| 4,982,372 | 1/1991 | Matsuo | 365/230.03 |
| 5,051,954 | 9/1991 | Toda et al. | 365/230.03 |
| 5,124,948 | 5/1992 | Takizawa et al. | 365/230.03 |
| 5,172,335 | 12/1992 | Sasaki et al. | 365/230.03 |

Primary Examiner—Eugene R. LaRoche
Assistant Examiner—Michael C. Kessell
Attorney, Agent, or Firm—Sughrue, Mion, Zinn, Macpeak & Seas

[57] ABSTRACT

In a semiconductor memory device, a transfer gate is disposed for each bit line, which classifies the bit lines, word lines, and memory cells at intersections therebetween into a plurality of groups. In a memory operation, portions of bit lines not employed in the operation are disconnected from sense amplifiers, which prevents charge and discharge operations from occurring therethrough. Consequently, the current which is caused by the charge and discharge operations through the bit lines and which occupies most portions of the current appearing in the memory device can be minimized, thereby reducing the total current flowing therethrough.

9 Claims, 5 Drawing Sheets

SEMICONDUCTOR MEMORY DEVICE WITH TRANSFER GATES ARRANGED TO SUBDIVIDE BIT LINES

BACKGROUND OF THE INVENTION

1. Field of the Invention

The present invention relates to a semiconductor memory device, and in particular, to a semiconductor memory device to be applied to a memory cell array of a dynamic random-access memory (DRAM).

2. Description of the Prior Art

Conventionally, a DRAM includes a memory cell array constituted with, for example, a first plate 10a and a second plate 10b as shown in FIG. 4. The plates 10a and 10b respectively include portions of the memory cell array. In the plate 10a, word lines WL0 to WL2n−1 and bit lines BL0 to BLm−1 and $\overline{BL0}$ to $\overline{BLm-1}$ are arranged to intersect each other. Moreover, a sense amplifier group 12a and row decoder 14a are disposed therein. Similarly, the plate 10b includes word lines WL0 to WL2n−1, bit lines BLm to BL2m−1 and $\overline{BLm}$ to $\overline{BL2m-1}$ which are arranged to intersect each other, a sense amplifier group 12b, and a row decoder 14b.

Each of the sense amplifier groups 12a and 12b is constituted with m sense amplifiers 0 to m−1 and m to 2m−1, whereas each of the row decoders 14a and 14b is disposed to drive word lines WL0 to WL2n−1. At each intersection between the word lines WL0 to WL2n−1 and the bit lines BL0 to BL2m−1 and $\overline{BL0}$ to $\overline{BL2m-1}$, there is formed a memory cell MC, which comprises a transistor and a capacitor. The sense amplifier groups 12a and 12b each are supplied with a sense amplifier activation signal $\phi_A$ and a bit likne precharge balance signal $\phi_P$. In the memory device shown in FIG. 4, since the memory cells MCs are arranged in a 2n (rows)×m(columns) array in each of the plates 10a and 10b, the memory device includes a total of 2n(rows)×2m(columns) memory cells MCs.

Referring now to a signal timing chart of FIG. 5, description will be given of a case where the memory cells are refreshed, for example, in a first row of the memory cell array.

When a row address strobe signal RAS is activated or enabled, the bit precharge balance signal $\phi_P$ is first set to a low level, which terminates a precharge operation on the bit lines. Next, the row decoders 14a and 14b respectively select two word lines WL0 and WL0 in the plates 10a and 10b, respectively, thereby setting these word lines to a high level. As a result, information is transmitted from the memory cells MC of the first row thus selected to the bit line BL0 and BLm. Assuming now that a memory cell MC representatively denoted by a solid circle at a cross-point between the word line WL0 and the bit line BL0 is loaded with "low" data at a low level, the level of the bit line BL0 is slightly decreased, leading to a potential difference ΔV1 between the bit line BL0 and the bit line $\overline{BL0}$ kept retained at a reference level $V_R$.

After the memory cell information is transmitted to the bit line, when a sense amplifier activation signal $\phi_A$ is supplied to and activates the sense amplifier groups 12a and 12b, the initial potential difference ΔV1 between bit lines appearing between the bit lines BL0 and $\overline{BL0}$ is amplified up to a level (Vcc−GND). When the sense operation is finished, the word line WL0 is restored to a low level and thereafter when the bit line precharge balance signal $\phi_P$ is again set to a high level, the bit lines BL0 and $\overline{BL0}$ are returned to the reference level $V_R$. Through the sequence of operations above, the 2m memory cells thus selected are completely refreshed.

Let us assume that the reference level $V_R$ of each bit line in a holding state is set to Vcc/2. Under this condition, when a memory cell refreshing operation is achieved, memory cell charge and discharge operations are conducted through the bit lines, causing the following current.

$$I = 2m \cdot C_D \cdot Vcc / (2 \cdot Tcyc) \quad (1)$$

where, $C_D$ is a bit line capacity and Tcyc denotes refresh cycle time. Most portions of the current appearing in a DRAM are occupied by the charge/discharge current flowing through the bit lines as represented by the expression (1). As can be appreciated from this expression, the current is proportional to the bit line capacity $C_D$ and the number 2m of sense amplifiers simultaneously selected. In consequence, the conventional memory device has a problem that when the memory capacity becomes larger, the current becomes greater in proportion to an increase in the number of pairs of bit lines associated with the increase in the memory capacity.

SUMMARY OF THE INVENTION

It is therefore an object of the present invention to provide a memory device wherein the charge/discharge current which flows through the bit lines which occupies most portions of the current flowing in the memory device is decreased, thereby minimizing the power consumption and suppressing a heat dissipation therefrom.

In accordance with the present invention, there is provided a semiconductor m emory device comprising a plurality of sense amplifiers, a plurality of bit lines in pair, the bit line pairs being connected to the sense amplifiers respectively associated therewith, a plurality of word lines arranged to intersect the bit lines, a plurality of memory cells each being arranged at an intersection between the bit lines and the word lines, and transfer gates each being arranged in association with each the bit line, wherein each bit line is subdivided into a plurality of zones by the transfer gate, thereby classifying the word lines, the memory cells, and the bit lines into a plurality of groups.

Moreover, in accordance with the present invention, in a semiconductor memory device having a plurality of memory blocks, each of the memory blocks comprises a plurality of sense amplifiers, a plurality of bit lines in pair, the bit line pairs being connected to the sense amplifiers respectively associated therewith, a plurality of word lines arranged to intersect the bit lines, a plurality of memory cells each being arranged at an intersection between the bit lines and the word lines, and transfer gates each being arranged in association with each the bit line, wherein each the bit line disposed in the memory block is subdivided into a plurality of zones by the transfer gate, thereby classifying the word lines, the memory cells, and the bit lines into a plurality of groups.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
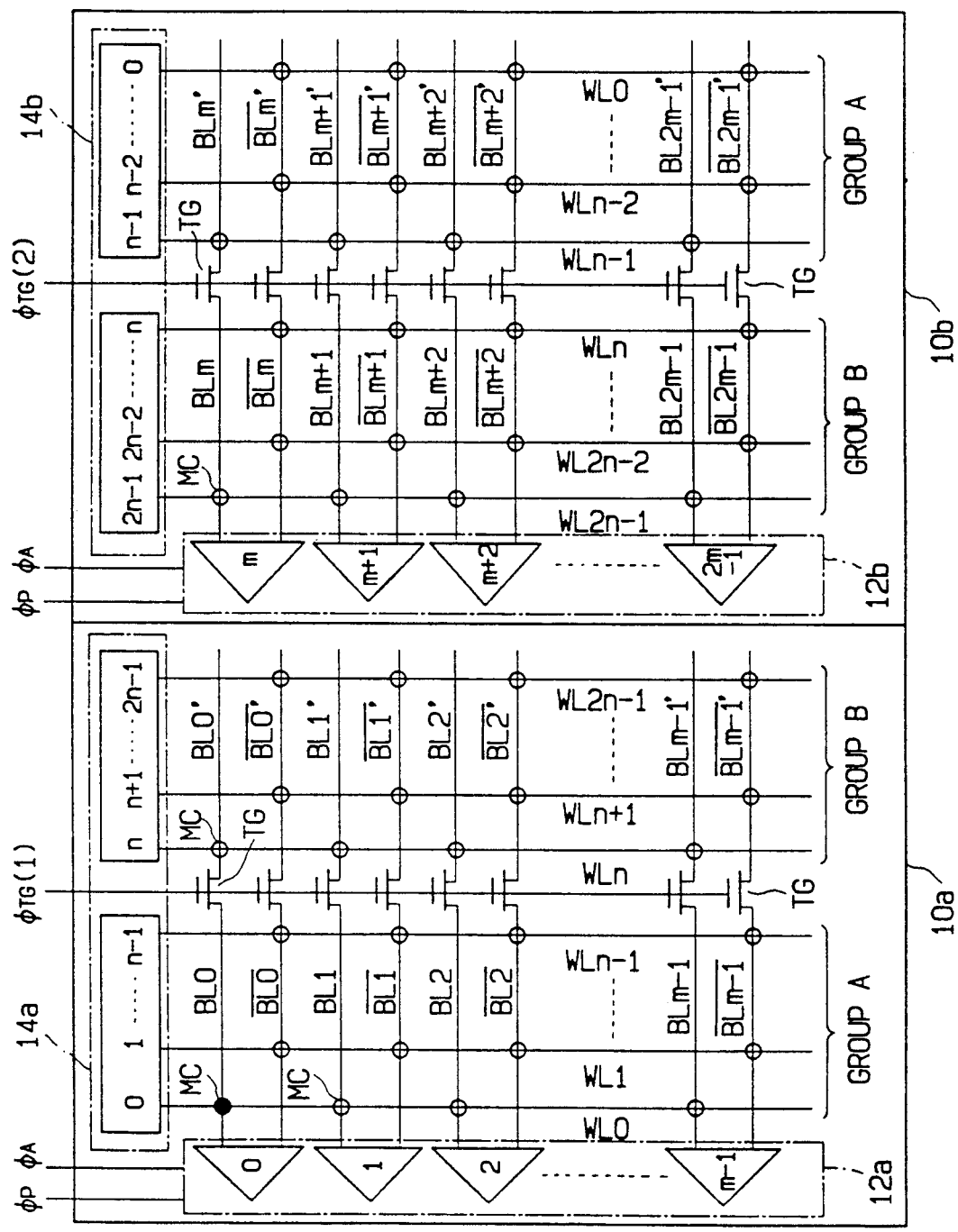
FIG. 1 is a schematic diagram showing the configuration of an embodiment of a memory device in accordance with the present invention.

FIG. 1 shows an embodiment of a memory cell array in accordance with the present invention. As shown in this diagram, the memory cell array comprises a first plate 10a and a second plate 10b, i.e. these plates respectively include portions of the memory cell array.

In the plate 10a, word lines WLx ($x=0, \ldots, 2n-1$) and bit lines BLy, $\overline{BLy}$, BLy', and $\overline{BLy}'$ ($y=0, \ldots, m-1$) are arranged to intersect each other. The configuration further includes a sense amplifier group 12a and a row decoder 14a. In this array, the sense amplifier group 12a is constituted with m sense amplifiers 0 to $m-1$, which are respectively connected to the paired bit lines BLy and $\overline{BLy}$ ($y=0, \ldots, m-1$). The bit lines BLy and $\overline{BLy}$ ($y=0, \ldots, m-1$) are coupled via transfer gates TGs with the bit lines BLy' and $\overline{BLy}'$ ($y=0, \ldots, m-1$), respectively. Each of the transfer gates TGs is disposed at substantially a central point equally apart from the bit lines connected to each other by the gate. Each time a transfer gate control signal $\phi_{TG}(1)$ is received, the transfer gates TGs respectively connect the associated bit lines to each other or disconnect the bit lines.

The sense amplifier group 12a activates the sense amplifiers 0 to $m-1$ each time a sense amplifier activating or enabling signal $\phi_A$ and a bit line precharge balance signal $\phi_P$ are inputted thereto so as to amplify the potential differences between the bit lines respectively associated therewith, thereby supervising the bit line precharge operation.

The word lines WLx ($x=0, \ldots, 2n-1$) are classified into a group A constituted with word lines WL0 to WLn-1 and a group B formed with word lines WLn to WL2n-1. A portion of the row decoder 14a is connected to the word lines WL0 to WLn-1 forming the group A so as to select and to drive the word lines WL0 to WLn-1 of the group A. The remaining portion of the row decoder 14a is connected to the word lines WLn to WL2n-1 forming the group B so as to select and to drive these word lines.

In the plate 10b, word lines WL2n-1 to WL0 and bit lines BLy, $\overline{BLy}$, BLy', and $\overline{BLy}'$ ($y=m, \ldots, 2m-1$) are arranged to intersect each other. The plate 10b further includes a sense amplifier group 12b and a row decoder 14b. The sense amplifier group 12b is constituted with m sense amplifiers m to $2m-1$, which are respectively connected to the paired bit lines BLy and $\overline{BLy}$ ($y=m, \ldots, 2m-1$). The bit lines BLy and $\overline{BLy}$ ($y=m, \ldots, 2m-1$) are linked via transfer gates TGs with the bit lines BLy' and $\overline{BLy}'$ ($y=m, \ldots, 2m-1$), respectively. Like in the plate 10a, each of the transfer gates TGs is disposed at substantially a central point equally apart from the bit lines connected to each other by the gate. Each time a transfer gate control signal $\phi_{TG}(2)$ is supplied thereto, the transfer gates TGs connect the related bit lines to each other or disconnect the bit lines.

The word lines WLx ($x=0, \ldots, 2n-1$) are arranged in the plate 10b in a sequence from WL2n-1 to WL0, which is opposite to the sequence thereof in the plate 10a. More specifically, the word line WL2n-1 is disposed at a position nearest to the sense amplifier group 12b, whereas the word line WL0 is at a position having the largest distance from the sense amplifier group 12b. In consequence, the group B including the word lines WLn to WL2n-1 is disposed near the sense amplifier group 12b, whereas the group A including word lines WL0 to WLn-1 is arranged at a position apart therefrom. Moreover, a portion of the row decoder 14b near the sense amplifier group 12b is connected to the word lines WL2n-1 to WLn of the group B to select and to control these word lines. The other portion of the row decoder 14b is connected to the word lines WLn-1 to WL0 of the group A, thereby selecting and controlling these word lines.

At each of the intersections between the word lines WL0 to WL2n-1 and the bit lines BLy, $\overline{BLy}$, BLy', and $\overline{BLy}'$ ($y=0, \ldots, m-1$), there is formed a memory cell CM, which comprises a transistor and a capacitor. In the memory device shown in FIG. 1, memory cells are disposed in a 2n(rows)×m(columns) matrix in each of the plates. Namely, the memory device has 2n(rows)×m(columns) memory cells in total.

In the embodiment, as described above, a transfer gate TG is disposed at a position which is equally apart from two bit lines associated therewith and the word lines are classified into the group A including word lines each having a smaller address value and the group B formed with word lines each assigned with a larger address value. In the plate 10a, the group A is positioned on the side of the sense amplifier group 12a; whereas, in the plate 10b, the group B is located on the side of the sense amplifier group 12b. Consequently, when the word line WL0 is selected, the word line WL0 in the vicinity of the sense amplifier group 12a is activated or enabled in the plate 10a; whereas, the word line WL0 apart from the sense amplifier group 12b is activated in the plate 10b.

Figure 2:
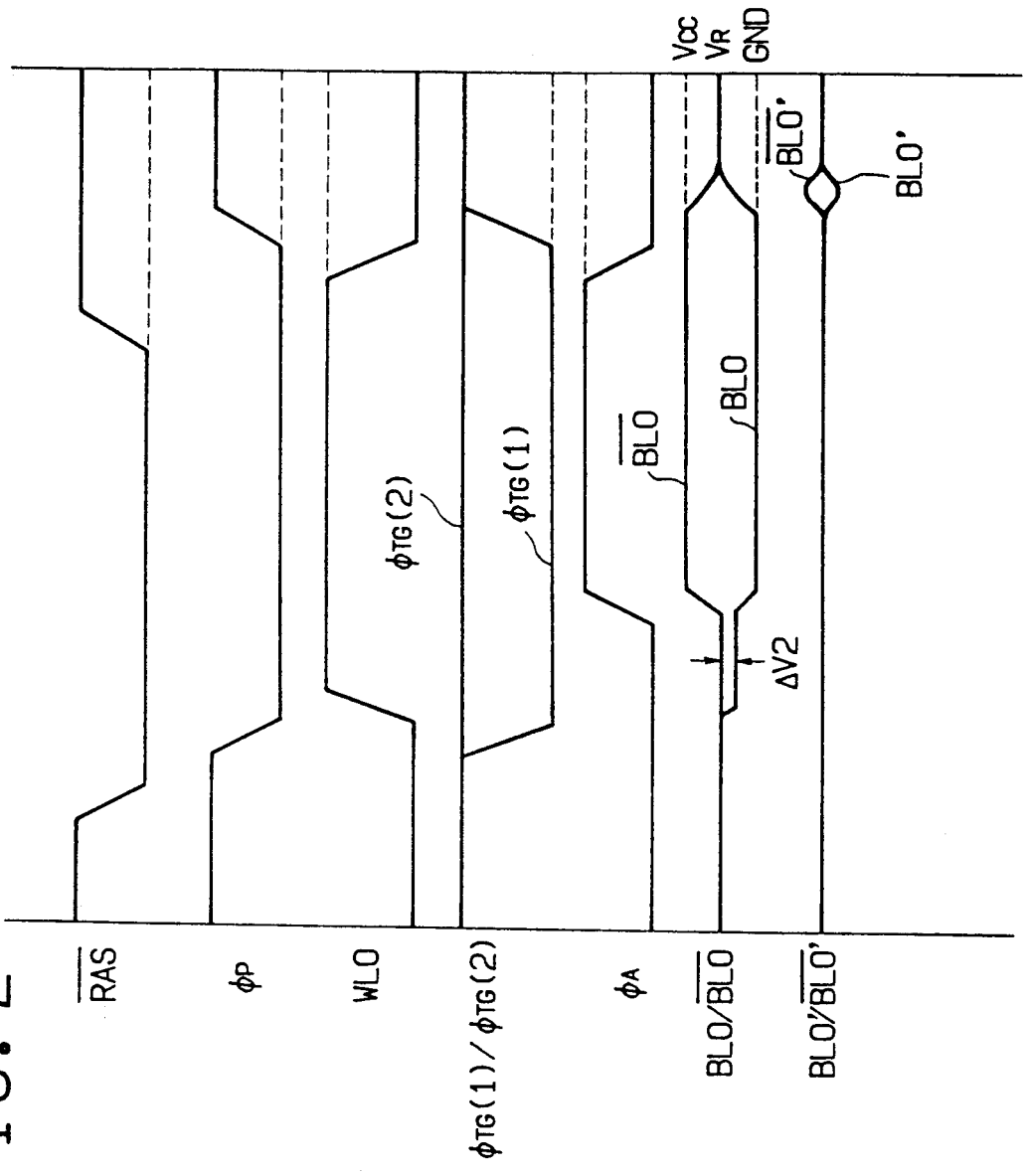
FIG. 2 is a signal timing chart showing the operation of the memory device of FIG. 1.

Subsequently, the operation of the memory device will be described by referring to the signal timing chart of FIG. 2. Each of the transfer gate control signals $\phi_{TG}(1)$ and $\phi_{TG}(2)$ is set to a high level in the holding state. When a row address strobe signal RAS is enabled, the state of the bit line precharge balance signal $\phi_P$ is altered to a low level. Next, the transfer gate TG is operated to accomplish a bit line separation in the plate 10a or 10b. In the case where the word lines WL0 to WLn-1 of the group A are to be selected, the state of the transfer gate control signal $\phi_{TG}(1)$ is changed to a low level. On the other hand, when the word lines WLn to WLn2n-1 of the group B are to be selected, the transfer gate control signal $\phi_{TG}(2)$ is set to a low level. In this embodiment, the row decoders 14a and 14b select the word lines WL0 respectively associated therewith and then the transfer gate control signal $\phi_{TG}(1)$ is set to a low level as shown in FIG. 2. The transfer gate control signal $\phi_{TG}(2)$ is kept retained at a high level. Thereafter, when the word line WL0 is set to a high level in the plate 10a or 10b to select a memory cell MC, memory cell information is transmitted therefrom to the related bit line.

Assuming here that a memory cell denoted by a solid circle at a cross-point between the word line WL0 and the bit line BL0 is loaded with "low" data and the bit line percharge level is $V_R$. Since the transfer gates TGs are turned off in the plate 10a, the bit line separation takes place and the bit line capacity therefore becomes to be half that of the conventional example described above. Consequently, the potential difference $\Delta V2$ between bit lines is attained as $\Delta V2 = 2 \cdot \Delta V1$, namely, there is obtained a potential difference signal having a potential difference which is twice that of the signal developed in the conventional example. On the other hand, since the transfer gates TGs are on in the plate 10b, the potential difference between bit lines is $\Delta V1$, which is equal to that developed in the conventional example.

After the memory cell information is delivered from the memory cell MC to the bit line BL0, the sense amplifier activation signal $\phi_A$ is supplied to activate the sense amplifier 0, which in turn amplifiers the potential difference between the bit lines BL0 and $\overline{BL0}$ up to a (Vcc−GND) level. Subsequently, when the word line WL0 and the sense amplifier activation signal $\phi_A$ are restored to a low level, the bit line precharge balance signal $\phi_P$ and the transfer gate control singal $\phi_{TG}(1)$ are enabled, thereby setting the bit lines BL0 and $\overline{BL0}$ again to the precharge level $V_R$. Through the sequence of operations above, the 2m memory cells thus selected are completely refreshed.

If the bit line precharge level $V_R$ of the holding state is set to Vcc/2, the current appearing in the memory device due to the charge and discharge operations through the bit lines is represented as follows.

$$I = (m \cdot C_D + m \cdot C_D/2)Vcc/(2 \cdot Tcyc)$$
$$= 3m \cdot C_D \cdot Vcc/(4 \cdot Tcyc)$$

Consequently, when compared with the current of the conventional example represented by the expression (1), the current flowing through the bit lines can be reduced in this memory device to 75% of that developed in the conventional memory.

Figure 3:
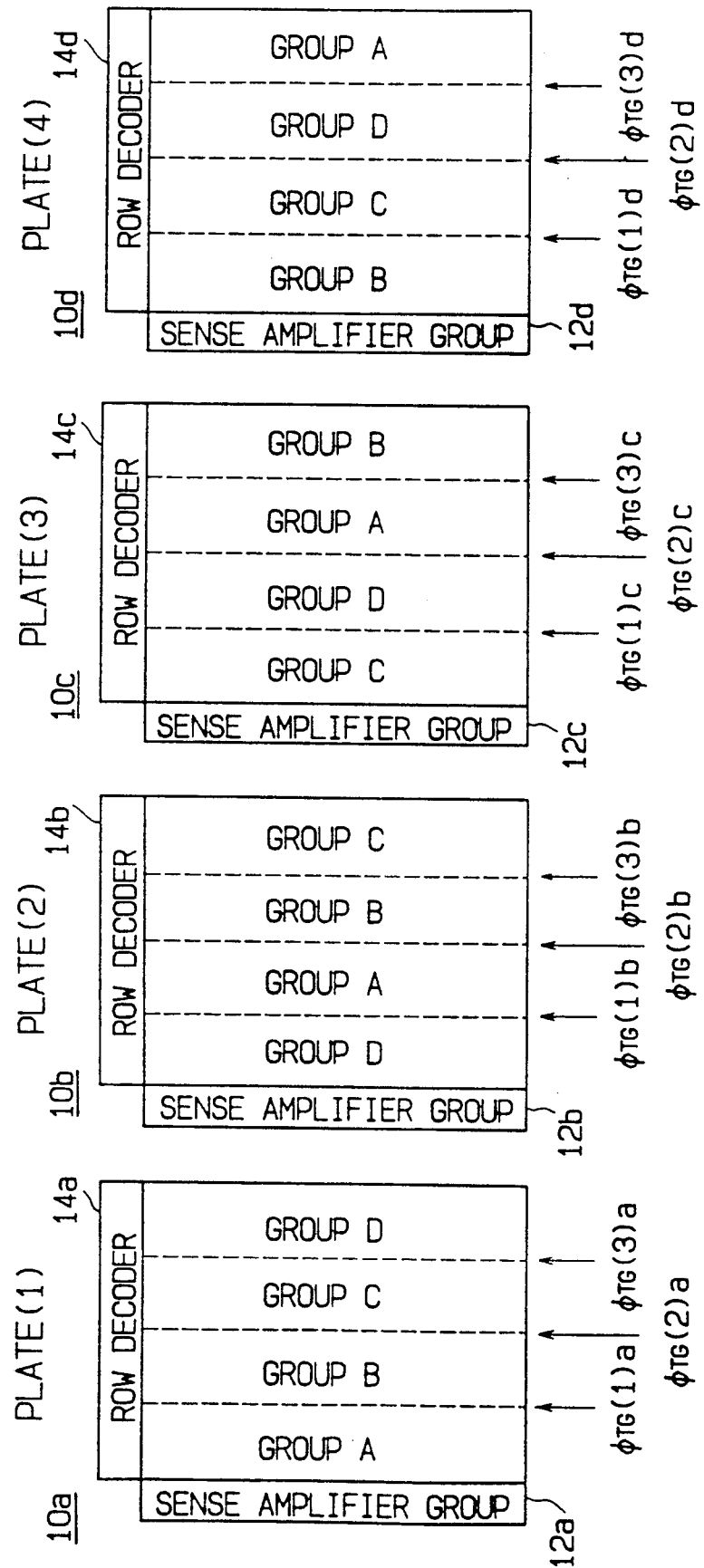
FIG. 3 is a diagram schematically showing the configuration of an alternative embodiment of a memory device in accordance with the present invention.
Figure 4:
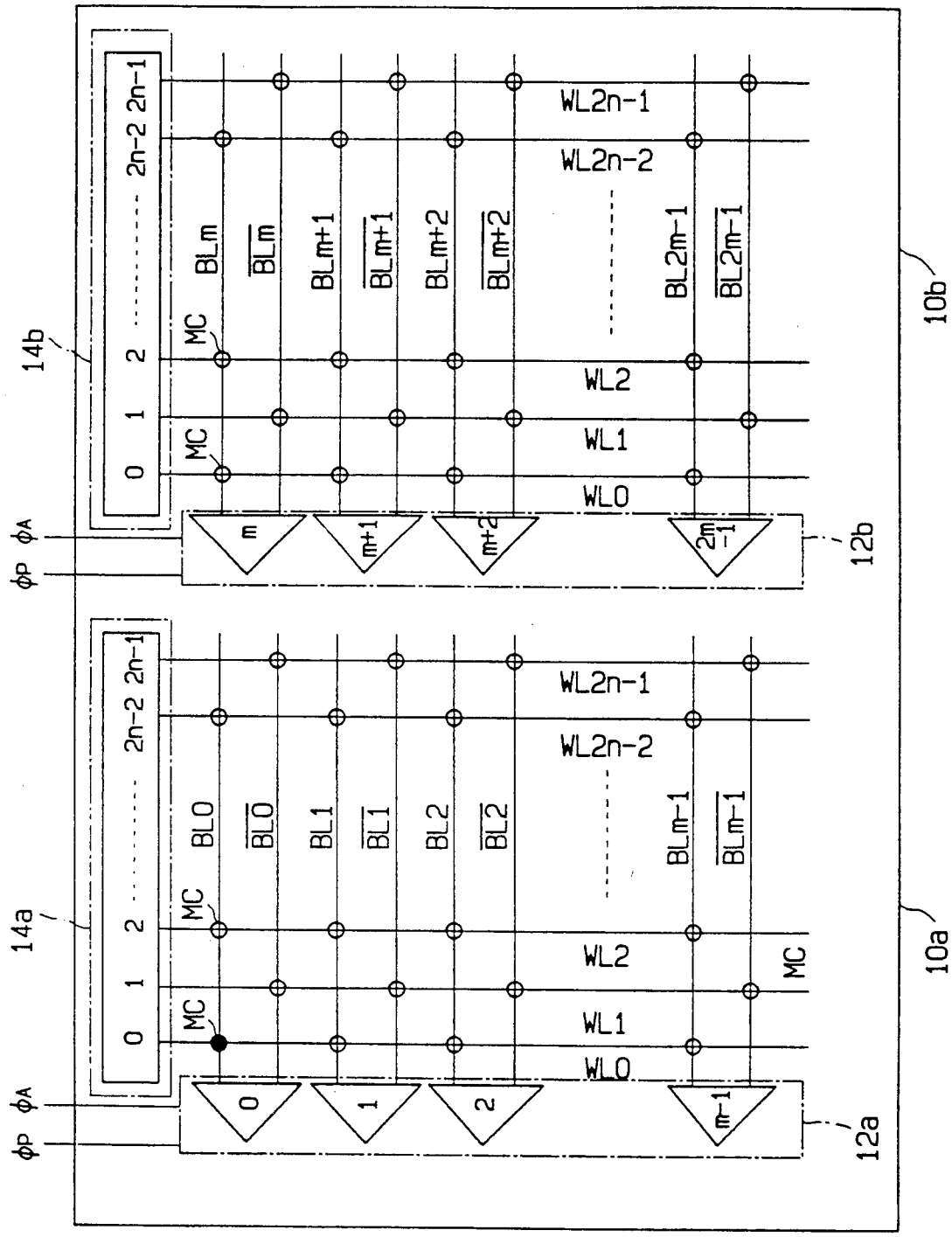
FIG. 4 is a diagram showing the configuration of a conventional memory device.
Figure 5:
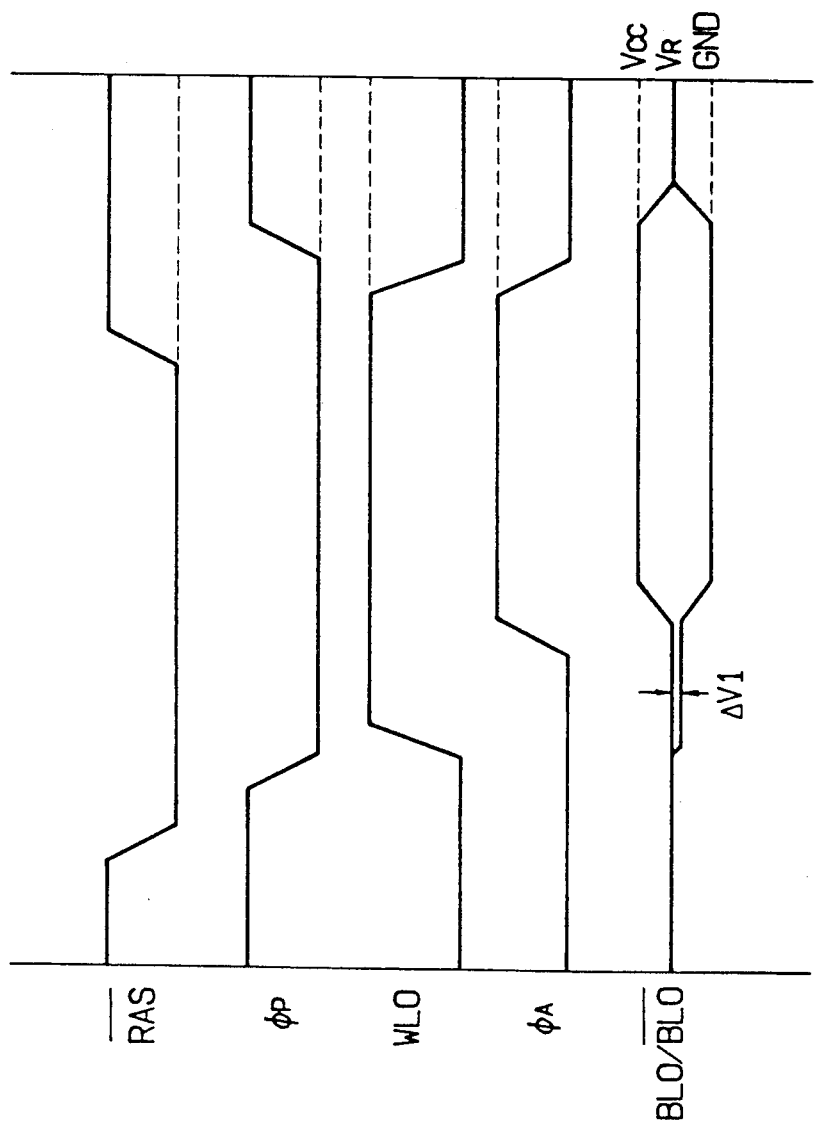
FIG. 5 is a signal timing chart showing the operation of the memory device of FIG. 4.

FIG. 3 shows an alternative embodiment of a memory cell array in accordance with the present invention. In the memory device of FIG. 3, the memory cell array includes four plates 10a to 10d having sense amplifier groups 12a to 12d and row decoders 14a to 14d, respectively.

In each of the four plates 10a to 10d of the memory cell array of this embodiment, each bit line is subdivided into four portions by a transfer gate disposed at positions indicated by a broken line in FIG. 3. In consequence, the word lines of each plate are also classified into four groups A to D in the order of addresses assigned thereto. The word line groups A to D are arranged in the plates 10a to 10d in respective manners as shown in FIG. 3.

Let us consider now a case where the word line group A is to be selected. In the refresh cycle, transfer gate control signals $\phi_{TG}(1)a$, $\phi_{TG}(2)b$, and $\phi_{TG}(3)c$ are set to a low level. Consequently, the currents flowing through the bit lines respectively of the plates 10a to 10d become to be ¼, 2/4, ¾, and 4/4 respectively of the currents which will be developed in an associated memory device of the prior art. As a result, when compared with the conventional memory, there is attained the following ratio between the total current appearing in the memory cell array and that developed in the prior art.

$$(¼ + 2/4 + ¾ + 4/4)/(4 \cdot 4/4) = 0.625$$

Namely, the total current flowing through the overall memory cell array can be reduced to 62.5% of that appearing in the conventional example. Moreover, when any other word line group is to be selected, the current is similarly minimized to 62.5% of that of the prior art.

Although the description has been given of a memory cell array comprising two or four plates in the embodiments above, the number of the plates of the memory device according to the present invention is not restricted by the embodiments. Moreover, the arrangement of the subdivided groups is not limited to those described in conjunction with the embodiments.

As described above, in accordance with the present invention, transfer gates are disposed to subdivide bit lines respectively associated therewith such that in a memory operation, a portion of bit lines not related to the operation is disconnected from sense amplifiers associated therewith. Consequently, in the memory operation, charge and discharge operations can be dispensed with for the disconnected portion of the bit lines. Resultantly, in accordance with the present invention, the charge and discharge operations through the bit lines, which most influence the magnitude of the current flowing in the semiconductor memory, can be minimized to decrease the power consumption and the heat dissipation.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor memory device, comprising:
    a plurality of sense amplifiers;
    a plurality of first bit line portions each coupled to an associated one of said sense amplifiers;
    a plurality of second bit line portions;
    a plurality of transfer gates each connected between an associated one of said first bit line portions and an associated one of said second bit line portions;
    a plurality of first word lines intersecting said first bit line portions;
    a plurality of second word lines intersecting said second bit line portions;
    a plurality of first memory cells each disposed at a different one of intersections of said first bit line portions and said first word lines; and
    a plurality of second memory cells each disposed at a different one of intersections of said second bit line portions and said second word lines,
    said transfer gates being supplied commonly with a control signal for turning each of said transfer gates OFF when at least one of said first word lines is selected, so as to electrically disconnect said second bit line portions from said sense amplifiers, and for turning each of said transfer gates ON when at least one of said second word lines is selected, so as to electrically connect said second bit line portions to said sense amplifiers through said first bit line portions.

2. The memory device as claimed in claim 1, wherein each of said sense amplifiers includes precharge means activated in a precharge period and each of said transfer gates is turned ON in said precharge period so that said precharge means precharges the associated ones of said first and second bit line portions.

3. A semiconductor memory device in accordance with claim 1, wherein each said memory cell includes a transistor and a capacitor.

4. A semiconductor memory device in accordance with claim 1, wherein each said transfer gate includes a field effect transistor.

5. A semiconductor memory device, comprising:
a first memory cell block, said first memory cell block including:
   a plurality of first sense amplifiers;
   a plurality of first bit line portions each coupled to an associated one of said first sense amplifiers;
   a plurality of second bit line portions;
   a plurality of first transfer gates each connected between an associated one of said first bit line portions and an associated one of said second bit line portions;
   a plurality of first word lines intersecting said first bit line portions;
   a plurality of second word lines intersecting said second bit line portions;
   a plurality of first memory cells each disposed at a different one of intersections of said first bit line portions and said first word lines; and
   a plurality of second memory cells each disposed at a different one of intersections of said second bit line portions and said second word lines,
said semiconductor memory device further comprising a second memory cell block, said second memory cell block including:
   a plurality of second sense amplifiers;
   a plurality of third bit line portions each coupled to an associated one of said sense amplifiers;
   a plurality of fourth bit line portions;
   a plurality of second transfer gates each connected between an associated one of said third bit line portions and an associated one of said fourth bit line portions;
   a plurality of third word lines intersecting said third bit line portions;
   a plurality of fourth word lines intersecting said fourth bit line portions;
   a plurality of third memory cells each disposed at a different one of intersections of said third bit line portions and said third word lines; and
   a plurality of fourth memory cells each disposed at a different one of intersections of said fourth bit line portions and said fourth word lines,
said first transfer gates being supplied commonly with a first control signal for turning each of said first transfer gates OFF when at least one of said first word lines is selected, so as to electrically disconnect said second bit line portions from said first sense amplifiers, and for turning each of said first transfer gates ON when at least one of said second word lines is selected, so as to electrically connect said second bit line portions to said first sense amplifiers, and
said second transfer gates being supplied commonly with a second control signal for turning each of said second transfer gates OFF when at least one of said third word lines is selected, so as to electrically disconnect said fourth bit line portions from said second sense amplifiers, and for turning each of said second transfer gates ON when at least one of said fourth word lines is selected, so as to electrically connect said fourth bit line portions to said second sense amplifiers.

6. The memory as claimed in claim 5, wherein at least one of said first word lines is selected together with at least one of said fourth word lines and at least one of said second word lines is selected together with at least one of said third word lines.

7. The memory device as claimed in claim 6, wherein each of said first and second sense amplifiers includes precharge means activated in a precharge period and said first and second control signals turns each of said first and second transfer gates ON in said precharge period so that all of said first, second, third and fourth bit line portions are precharged in said precharge period.

8. A semiconductor memory device in accordance with claim 5, wherein each said memory cell includes a transistor and a capacitor.

9. A semiconductor memory device in accordance with claim 5, wherein each said transfer gate includes a field effect transistor.

* * * * *

UNITED STATES PATENT AND TRADEMARK OFFICE
CERTIFICATE OF CORRECTION

PATENT NO. : 5,267,215
DATED : November 30, 1993
INVENTOR(S) : Akira TSUJIMOTO

It is certified that error appears in the above-indentified patent and that said Letters Patent is hereby corrected as shown below:

Col. 1, lines 18-19, delete "BLO to BLm -1", and insert --$\overline{BLO}$ to $\overline{BLm}$ -1--;

Col. 1, lines 31-32, delete "BLO to BL2m -1", and insert --$\overline{BLO}$ to $\overline{BL2m}$ -1--;

Col. 1, line 59, delete the second occurrence of "BLO", and insert --$\overline{BLO}$--;

Col. 1, line 66, delete "BLO", and insert --$\overline{BLO}$--.

Col. 2, line 2, delete the second occurrence of "BLO", and insert --$\overline{BLO}$--.

Col. 5, line 22, delete the second occurrence of "BLO", and insert --$\overline{BLO}$--.

Signed and Sealed this

Twenty-third Day of August, 1994

Attest:

BRUCE LEHMAN

*Attesting Officer*     *Commissioner of Patents and Trademarks*